(12) United States Patent
Truong et al.

(10) Patent No.: US 7,042,220 B2
(45) Date of Patent: May 9, 2006

(54) MAGNETIC RESONANCE IMAGING SYSTEM AND METHOD

(75) Inventors: Trong-Kha Truong, Durham, NC (US); Petra Schmalbrock, Columbus, OH (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 11/118,865

(22) Filed: Apr. 29, 2005

(65) Prior Publication Data

US 2005/0270027 A1 Dec. 8, 2005

Related U.S. Application Data

(60) Provisional application No. 60/567,386, filed on Apr. 30, 2004.

(51) Int. Cl.
*G01V 3/00* (2006.01)

(52) U.S. Cl. ........................ 324/309; 324/307

(58) Field of Classification Search ................ 324/309, 324/307
See application file for complete search history.

(56) References Cited

U.S. PATENT DOCUMENTS 5,351,006 A * 9/1994 Sumanaweera et al. ..... 324/309
6,157,192 A * 12/2000 Cordes ........................ 324/309

FOREIGN PATENT DOCUMENTS

WO    WO 03/098233    * 11/2003

OTHER PUBLICATIONS

Yang QX et al., "Multi-Gradient Echo with Susceptibility Inhomogeneity Compensation (MGESIC): Demonstration of fMRI in the Olfactory Cortex at 3.0 T", Magn Reson in Med 37:331-335 (1997).*

Yang QX et al., "Removal of Local Field Gradient Artifacts in T2*-Weighted Images at High Fields by Gradient-Echo Slice Excitation Profile Imaging", Magn Reson in Med 39:402-409 (1998).*

Constable RT and Spencer DD, "Composite Image Formation in z-Shimmed Functional MR Imaging", Magn Reson in Med 42:110-117 (1999).*

(Continued)

*Primary Examiner*—Diego Gutierrez
*Assistant Examiner*—Jeremiah Shipman
(74) *Attorney, Agent, or Firm*—Calfee, Halter & Griswold LLP

(57) ABSTRACT

An method for producing magnetic resonance imaging data is disclosed. An example embodiment of the method includes acquiring a series of M images at a plurality of echo times using a multi-echo pulse sequence. A compensation gradient is added as a blipped gradient in the slice direction before the first image acquisition and between each subsequent image acquisitions to compensate for static magnetic field inhomogeneities. The method also includes repeating the step of acquiring the series of M images N times. The compensation gradient is set to a predetermined value for each acquisition. The method further includes combining the N acquired images for each of the M echo times to obtain M corrected images, computing a map of $T_2^*$ values from the M corrected images, and storing data representing the N acquired images and the M corrected images. Systems and computer readable media for implementing the method are also disclosed.

18 Claims, 7 Drawing Sheets

OTHER PUBLICATIONS

Song AW, "Single-Shot EPI With Signal Recovery From the Susceptibility-Induced Losses", Magn Reson in Med 46:407-411 (2001).*

Yang, et al., Removal of Local Field Gradient in T2*-Weighted Images at High Fields by Gradient-Echo Slice Excitation Profiled Imaging, MRM 39: 402-409 (1998).

Yang, et al., Removal of Local Field Gradient Artifacts in T2* Measurement and T2* Contrast as High Field, ISMRM (1998).

Liu, et al., the Measured T2* of human brain with macroscopic field inhomogeneity compensation at 7 Tesla, Proc. Intl. Soc. Mag. Reson, Med 9, p. 1352, (2001).

Imaging Notes, Part IV, BME 483, MRI Notes (10 pages).

Wagshul, Pulse Sequences, Stony Brook University, Dept. of Radiology (36 pages).

Watts, et al., Magnetic Resonance Imaging: Physical Principles, Weill Medical College of Cornell University (35 pages).

* cited by examiner ated later.

MAGNETIC RESONANCE IMAGING SYSTEM AND METHOD

CROSS-REFERENCE TO RELATED APPLICATIONS

This application claims priority to U.S. Provisional Application Ser. No. 60/567,386, entitled "Magnetic Resonance Imaging Method and Apparatus", filed Apr. 30, 2004 which is hereby incorporated by reference in its entirety.

TECHNICAL FIELD

This application concerns methods and apparatus for producing magnetic resonance images. More particularly, the application relates to systems and methods for gradient compensation in certain magnetic resonance imaging environments.

BACKGROUND

Knowledge of $T_2^*$ relaxation times at ultra-high field strength is needed for optimizing acquisition parameters and understanding relaxation mechanisms. Standard $T_2^*$ measurements, such as conventional multi-echo gradient echo ("GE") sequences, are affected by static magnetic field ($B_0$) inhomogeneity, which is particularly severe at ultra-high field strength, resulting in erroneous $T_2^*$ values.

The Gradient Echo Slice Excitation Profile Imaging ("GESEPI") method was developed for $T_2^*$-weighted imaging with $B_0$ inhomogeneity compensation. This method recovers signal loss due to intravoxel dephasing in the slice direction, where the voxel size in two-dimensional (2D) imaging is typically the largest, and consequently the $B_0$ inhomogeneity within a voxel is most severe. More specifically, the GESEPI method is based on a conventional 2D GE sequence, with an additional compensation gradient $G_c$ superimposed on the slice rephaser gradient. A series of N GE images are successively acquired using N equidistant $G_c$ values with an increment $\Delta G_c$ and a range $\pm G_{c,max}$. A three-dimensional (3D) Fourier transform is then applied to the 3D data set to reconstruct a series of N images representing the slice profile at each pixel. Finally, a subset of these images are summed to yield a final corrected image with a slice thickness equal to that of an equivalent conventional 2D GE image.

The mGESEPI method is a multi-echo version of the GESEPI method, where a train of M GE images are acquired at different echo times (TEs) for each compensation gradient $G_c$. For each TE, a corrected image is reconstructed as in the GESEPI method, and a $T_2^*$ map is computed by fitting a monoexponential decay pixel-by-pixel to these M corrected images.

The susceptibility-induced gradient in the slice direction $G_{z,susc}$ that can be compensated for by a given $G_c$ at a time TE is given by the following equation:

$$\int G_c(t)dt = G_{z,susc}TE \qquad (1)$$

Since the left-hand side of Equation (1) is constant, the susceptibility-induced gradient $G_{z,susc}$ that can be compensated for by this method decreases as TE increases. This implies that the $T_2^*$ measurements are accurate only if the largest $G_c$ value ($G_{c,max}$) is able to compensate for the largest $G_{z,susc}$ ($G_{z,susc,max}$) at the last echo. However, satisfying this condition at ultra-high field strength requires a large $G_{c,max}$ and a large number of compensation gradients N, resulting in excessive acquisition times for in vivo studies.

This mGESEPI method has been used to measure $T_2^*$ values in the human brain at 3 tesla (T) and 7 T, and in the mouse brain at 14 T. When implemented on the 8 T human whole-body MRI system, this sequence was found to produce accurate $T_2^*$ measurements, but acquisition times became prohibitive for in vivo studies. Accordingly, a need exists for a method and apparatus which provides faster and accurate $T_2^*$ measurements.

SUMMARY OF THE INVENTION

The following presents a simplified summary of apparatus, systems and methods associated with gradient compensation in Magnetic Resonance Imaging to facilitate a basic understanding of these items. This summary provides a conceptual introduction in a simplified form as a prelude to the more detailed description that is presented later.

According to one aspect of the present invention, there is disclosed an example Magnetic Resonance Imaging ("MRI") method for $T_2^*$-weighted imaging and $T_2^*$ relaxation time measurement with static magnetic field ($B_0$) inhomogeneity compensation. This method is an improvement over the multi Gradient Echo Slice Excitation Profile Imaging ("mGESEPI") method and has the advantage of being faster and more efficient. The disclosed apparatus, methods and systems are beneficial for various MRI environments, including high field ($\geq 3$ T) and ultra-high field MRI ($\geq 7$ T), which is becoming progressively available for human whole-body imaging and which is affected by more severe $B_0$ inhomogeneity than MRI at clinical field strength (1.5 T). The present application further discloses apparatus and systems which employ the method.

According to another aspect of the present invention, there is disclosed an example method for producing magnetic resonance imaging data. The method includes the step of acquiring a series of M images at a plurality of echo times using a multi-echo pulse sequence. A compensation gradient is added as a blipped gradient in the slice direction before the first image acquisition and between each subsequent image acquisitions to compensate for static magnetic field inhomogeneities. The method also includes the step of repeating the step of acquiring the series of M images N times. The compensation gradient is set to a predetermined value for each acquisition. The method further includes the steps of combining the N acquired images for each of the M echo times to obtain M corrected images, computing a map of $T_2^*$ values from the M corrected images; and storing the acquired and processed data.

According to other aspects of the present invention, an MRI system and a computer-readable storage medium are disclosed for implementing the above-described method.

Potential applications include but are not limited to functional MRI, such as neuro-functional MRI, for example, and quantitative MRI for tissue characterization and optimization of image contrast. One example for quantitative MRI tissue characterization is the measurement of iron content in the brain for assessment of normal aging and neurodegenerative disease such as Alzheimer's disease.

The objects, features and advantages of the present invention are readily apparent from the following description of example embodiments when taken in connection with the accompanying drawings.

BRIEF DESCRIPTION OF THE DRAWINGS

Comprehension of the invention is facilitated by reading the following detailed description, in conjunction with the associated drawings, in which.

DETAILED DESCRIPTION OF THE DRAWINGS

Figure 1:
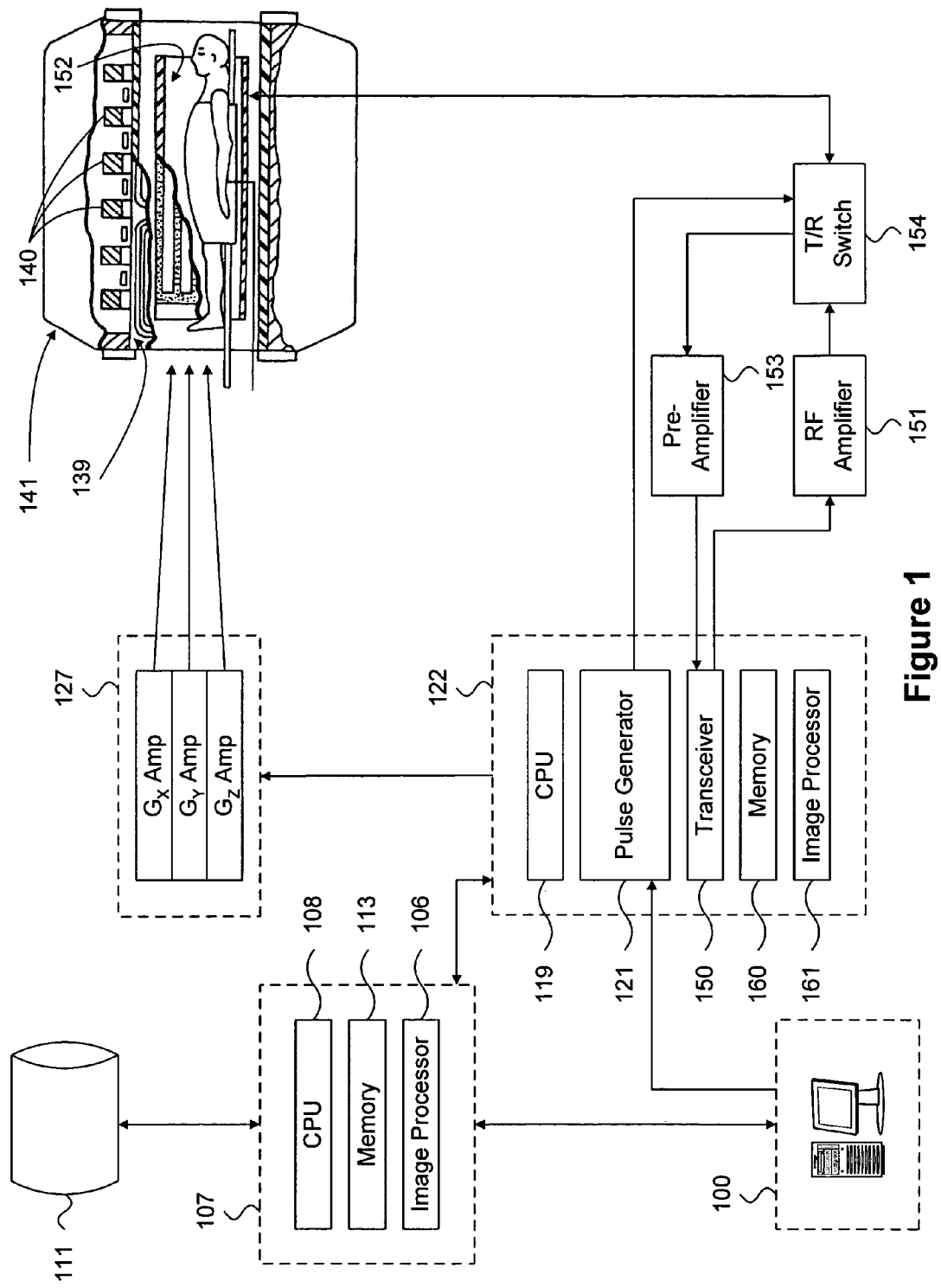
FIG. 1 is a schematic block diagram illustrating an example system embodying the present invention.

Example methods, apparatus, systems, and computer readable media are now described with reference to the drawings, where like reference numerals are used to refer to like elements throughout. In the following description, for purposes of explanation, numerous specific details are set forth in order to facilitate a thorough understanding of the methods and systems. It may be evident, however, that the methods and systems can be practiced without these specific details. In other instances, well-known structures and devices are shown in block diagram form in order to simplify the description.

Referring first to FIG. 1, there is shown the major components of an example MRI system which incorporates the present invention. The operation of the system is controlled from an operator console 100. The console 100 communicates with a separate computer system 107 that enables an operator to control the production, storage and display of images. The computer system 107 includes an image processor module 106, a CPU module 108 and a memory module 113. The computer system 107 may include or have access to a storage module 111 for storage of image data and/or programs. The computer system 107 communicates with a separate system control 122.

The system control 122 includes a CPU module 119 and a pulse generator module 121 which connects to the operator console 100. The system control 122 receives commands from the operator which indicate the scan sequence that is to be performed. The pulse generator module 121 operates the system components to carry out the desired scan sequence. It produces data which indicates the timing, amplitude and shape of the radiofrequency (RF) pulses which are to be produced, and the timing of and length of the data acquisition window. The pulse generator module 121 connects to a set of gradient amplifiers 127, to indicate the timing and shape of the gradient pulses to be produced during the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for spatially encoding acquired signals. The gradient coil assembly 139 forms part of a magnet assembly 141 which includes a magnet 140 and an RF coil 152. A transceiver module 150 in the system control 122 produces pulses which are amplified by an RF amplifier 151 and coupled to the RF coil 152 by a transmit/receive switch 154. The resulting signals radiated by the excited nuclei in the subject may be sensed by the same RF coil 152 and coupled through the transmit/receive switch 154 to a preamplifier 153. The amplified NMR signals are demodulated, filtered, and digitized in the receiver section of the transceiver 150.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an image data set. This image data set is conveyed to the computer system 107 where it may be stored in storage module 111. In response to commands received from the operator console 100, this image data set may be further processed by the image processor 106 and conveyed to the operator console 100.

Figure 2:
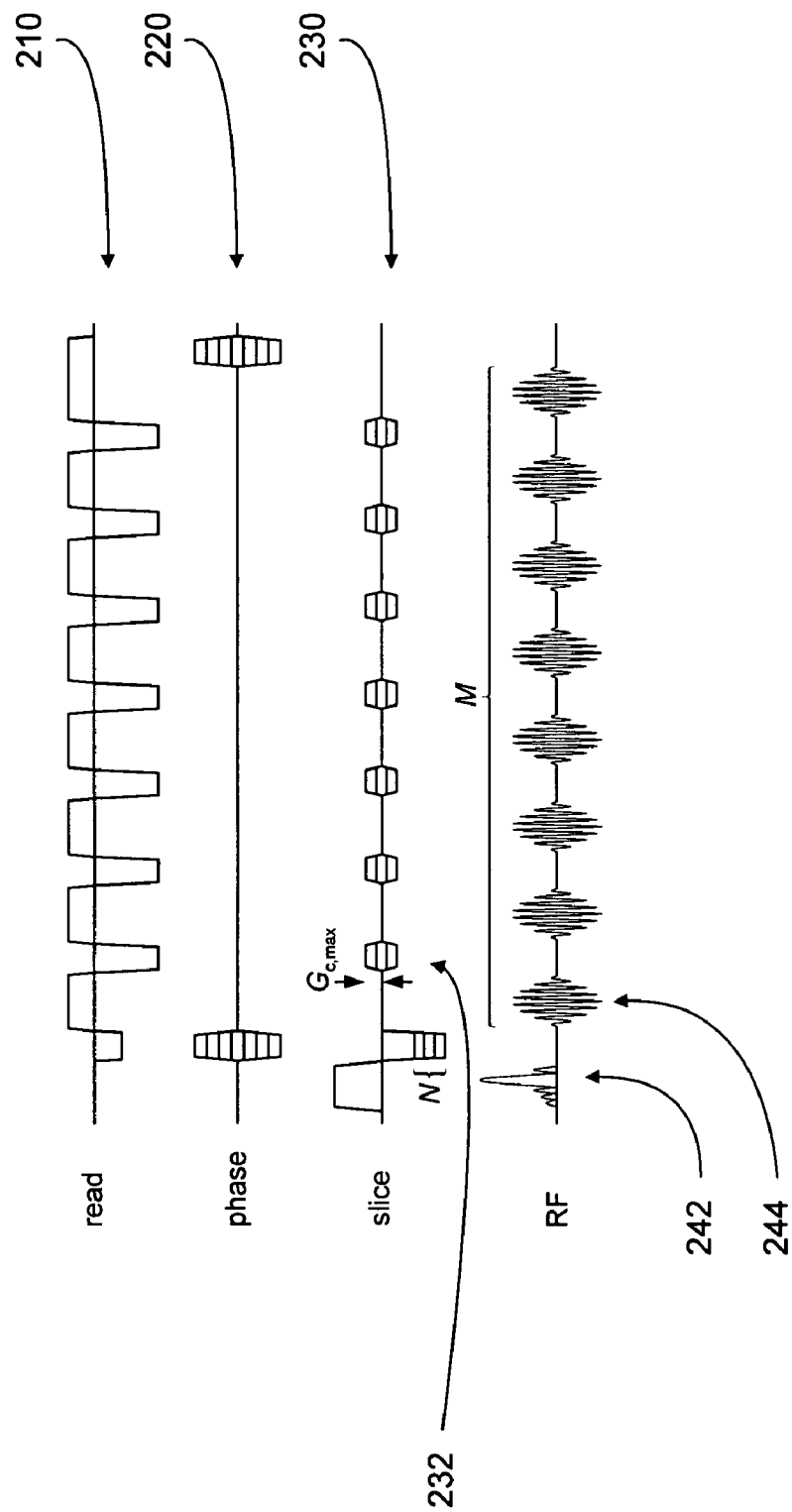
FIG. 2 is a graphical representation of a bmGESEPI pulse sequence.

The present invention provides a solution to certain shortcomings of the mGESEPI method. It is based on an mGESEPI sequence in which the compensation gradient $G_c$ is added as a blipped gradient in the slice direction between each echo acquisition. As such, this new method was named blipped mGESEPI (bmGESEPI). FIG. 2 is a graphical representation of a bmGESEPI pulse sequence, showing the gradient waveforms in the readout direction 210, the phase encoding direction 220, and the slice direction 230, as well as the radiofrequency pulse 242 and the series of acquired signals one of which is identified by reference numeral 244. One of the blipped compensation gradients is labeled 232. In this method, $\int G_c \, dt$ is proportional to TE, so that the same $G_{z,susc}$ is compensated for at each echo. For the $T_2$* measurements to be accurate, the $G_{c,max}$ which compensates for $G_{z,susc,max}$ is a factor M smaller than in the mGESEPI method, thus allowing a reduction of N as well as the acquisition time by the same factor. This bmGESEPI method is therefore more efficient and allows significantly faster and accurate $T_2$* measurements.

In one example, the system is embodied as the 8 T human whole-body MRI system. Such a system was used for performing phantom and human studies, using transverse electromagnetic RF coils with a single strut or with 16 struts and 4 excitation ports. Such studies are described more fully in Truong T-K et al., "Blipped mGESEPI (bmGESEPI) for Fast and Accurate $T_2$* Measurements with $B_0$ Inhomogeneity Compensation" presented at the Twelfth Scientific Meeting and Exhibition of the International Society for Magnetic Resonance in Medicine, Kyoto, Japan, 15–21 May 2004, p. 2307; Truong T-K, "Susceptibility effects in ultra-high field magnetic resonance imaging of the human brain", Ph.D. dissertation, The Ohio State University, 2004; and Truong T-K et al., "Blipped multi Gradient Echo Slice Excitation Profile Imaging (bmGESEPI) for Fast and Accurate $T_2$* Measurements with $B_0$ Inhomogeneity Compensation" submitted to Magnetic Resonance in Medicine Apr. 26, 2005, each of which is hereby incorporated by reference in its entirety.

To demonstrate the accuracy and effectiveness of the present invention, $T_2$* maps were acquired using a conventional multi-echo GE method, the mGESEPI method, and the bmGESEPI method. All echoes were acquired using readout gradients of same polarity to avoid misregistration errors due to susceptibility artifacts, gradient imbalance, and/or eddy current effects. An asymmetric sinc (sin(x)/x) RF pulse was used to shorten the TEs. Furthermore, minimum gradient ramp times and durations as well as maximum gradient strength were used whenever possible to obtain the shortest TEs and interecho spacing ΔTE achievable in order to cover the $T_2^*$ relaxation decay with a sufficient number of echoes, given the short $T_2^*$ values at ultra-high field strength. A relatively short repetition time (TR) was used to limit the acquisition time of the mGESEPI and bmGESEPI methods. Nevertheless, the signal-to-noise ratio was found to be sufficient due to the inherent oversampling in the slice direction in both methods. A spoiler gradient was applied in the readout direction at the end of the sequence.

$B_0$ maps were acquired using a 3D dual-echo GE sequence, and maps of the $B_0$ gradient along the slice direction were computed to obtain an estimate of the susceptibility-induced gradient in the slice direction $G_{z,susc}$. These maps were used for two purposes: first, to determine optimal parameters for the mGESEPI and bmGESESPI methods, and second, to correlate the $B_0$ inhomogeneity with the artifacts observed on the $T_2^*$ maps and to assess the degree of compensation achieved with the mGESEPI and bmGESEPI methods.

$B_0$ maps were obtained by numerical simulations and experimental measurements to determine optimal parameters for both the mGESEPI and bmGESEPI methods. First, a $G_{z,susc,max}$ value was determined from maps of the $B_0$ gradient in the slice direction for a particular slice. Note that this value, which is the largest $G_{z,susc}$ to be compensated for, does not necessarily have to be the maximum $G_{z,susc}$ over the whole slice. For example, a value of 0.7 ppm/cm was selected for the phantom study, which is the largest $G_{z,susc}$ in most regions of the phantom. For the human studies, a value of 0.8 ppm/cm was selected, which is well above the $G_{z,susc}$ values in most regions of the brain, with the exception of regions close to air/tissue interfaces, such as in the central inferior frontal lobes just superior to the planum sphenoidale, as well as in the lateral inferior temporal lobes near the mastoid and middle ear air spaces. Then, the $G_{c,max}$ required for each method was computed from this chosen $G_{z,susc,max}$ value using Equation (1). This value was 160% (of the slice rephaser gradient amplitude) for the mGESEPI method and 16% for the bmGESEPI method for both the phantom and human studies. Note that these values are expressed as percentages, so that they are independent of the slice rephaser gradient duration, which can be arbitrary. However, they are still dependent on the slice select gradient time integral, which in turn depends on the slice thickness. The number of compensation gradient steps N was then set to 80 for the mGESEPI method and 8 for the bmGESEPI method, in order to keep the same $G_{c,max}/N$ ratio (or equivalently, the same $\Delta G_c$ increment) for both methods. Note that the parameters $G_{c,max}$ and N, and consequently the acquisition time, are a factor M smaller for the bmGESEPI method, due to its improved efficiency over the mGESEPI method.

The performance of the mGESEPI method was also studied with a range of smaller N values and either the same $G_{c,max}/N$ ratio or the same $G_{c,max}$ value as illustrated in Table 1. However, rather than acquiring all of these additional data sets, the appropriate data were selected in k-space from the data set acquired with $G_{c,max}/N=160\%/80$. For example, the central 8 $k_x$-$k_y$ planes of k-space were used to simulate the $G_{c,max}/N=16\%/8$ acquisition, whereas every $10^{th}$ $k_x$-$k_y$ plane along the $k_z$ direction was used to simulate the $G_{c,max}/N=160\%/8$ acquisition. For these simulations, the data in k-space were interpolated along $k_z$ as needed.

TABLE 1

$G_{c,max}$ and N parameters used for the mGESEPI and bmGESEPI methods.

| phantom study | | | human studies | | |
|---|---|---|---|---|---|
| $G_{z,susc,max}$ (ppm/cm) | $G_{c,max}$ | N | $G_{z,susc,max}$ (ppm/cm) | $G_{c,max}$ | N |
| mGESEPI | | | | | |
| 0.72 | 160% | 80 | 0.82 | 160% | 80 |
| 0.58 | 128% | 64 | 0.66 | 128% | 64 |
| 0.43 | 96% | 48 | 0.49 | 96% | 48 |
| 0.29 | 64% | 32 | 0.33 | 64% | 32 |
| 0.14 | 32% | 16 | 0.16 | 32% | 16 |
| 0.07 | 16% | 8 | 0.08 | 16% | 8 |
| 0.72 | 160% | 64 | 0.82 | 160% | 64 |
| 0.72 | 160% | 48 | 0.82 | 160% | 48 |
| 0.72 | 160% | 32 | 0.82 | 160% | 32 |
| 0.72 | 160% | 16 | 0.82 | 160% | 16 |
| 0.72 | 160% | 8 | 0.82 | 160% | 8 |
| bmGESEPI | | | | | |
| 0.72 | 16% | 16 | 0.82 | 16% | 16 |
| 0.72 | 16% | 8 | 0.82 | 16% | 8 |

Figure 3:
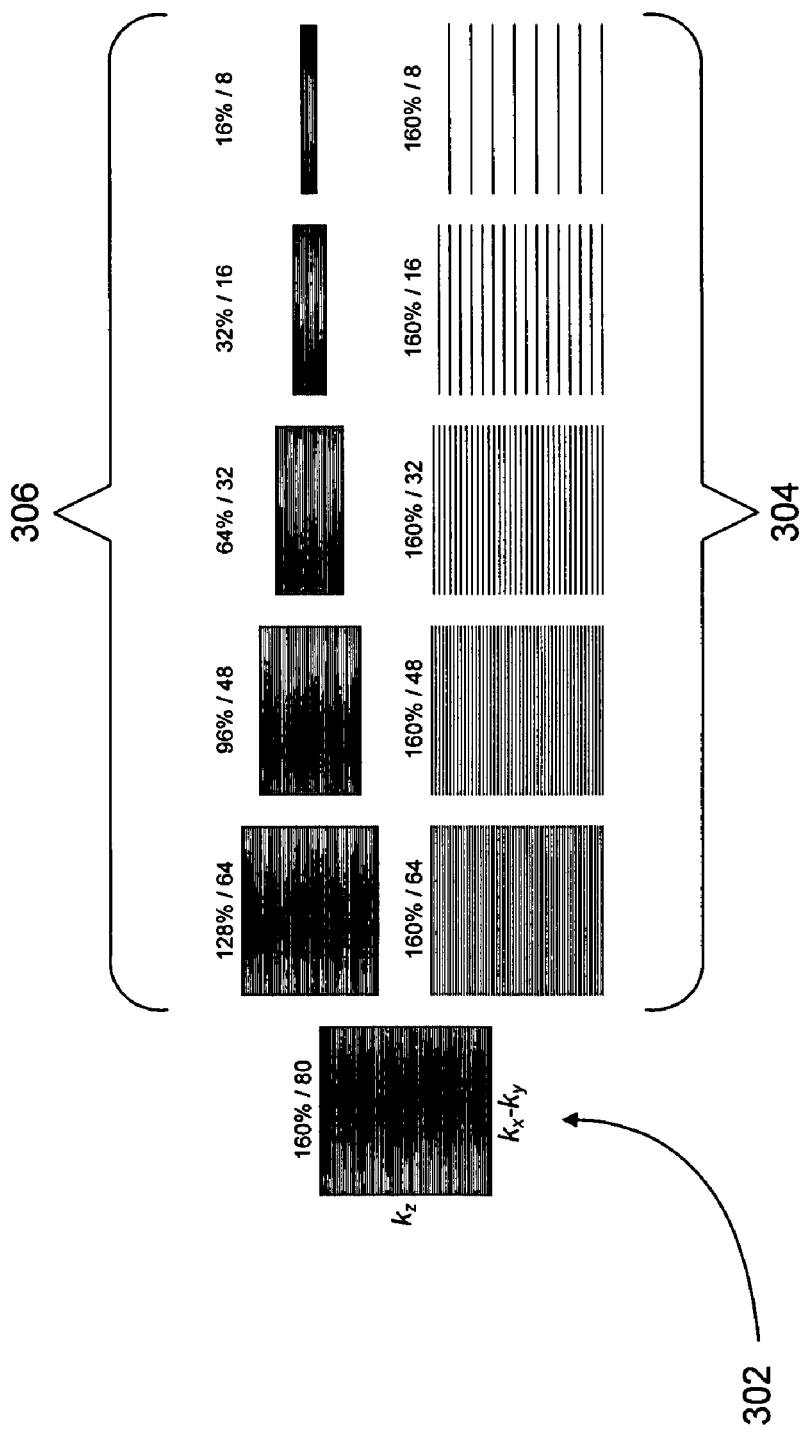
FIG. 3 is an example set of k-space diagrams used in accordance with the present invention.

FIG. 3 illustrates k-space diagrams showing how the mGESEPI data set acquired with $G_{c,max}/N=160\%/80$ (302) was used to simulate mGESEPI acquisitions with smaller N values and either the same $G_{c,max}/N$ ratio (306) or the same $G_{c,max}$ value (304) by selecting appropriate $k_x$-$k_y$ planes in k-space from the original data set. The numbers at the top of each diagram correspond to $G_{c,max}$ and N, respectively.

In addition, since the improved efficiency of the bmGESEPI method allows trading off some acquisition time for an increased N value, and possibly more accurate $T_2^*$ measurements, data were acquired using the bmGESEPI method with $G_{c,max}/N=16\%/16$, and then the $G_{c,max}/N=16\%/8$ acquisition for direct comparison with the mGESEPI method was simulated by selecting every other $k_x$-$k_y$ plane along $k_z$ in k-space.

The example system was used to study a cylindrical phantom (diameter 10 cm, length 25 cm) containing a 5 mm diameter air-filled tube surrounded by a gel made of 4% agarose, 2.5 mM $CuSO_4$, and 0.125 M NaCl. The imaged slice was an axial slice 10 mm away from the center of the air-filled tube and was therefore entirely in the gel. This slice was chosen so as to obtain similar $G_{z,susc}$ values as for a human brain, based on numerical and experimental $B_0$ maps, so that similar parameters could be used for the phantom and the human studies. $T_2^*$ maps were acquired using the GE, mGESEPI, and bmGESEPI methods and a Bo map was acquired using the dual-echo GE method with the parameters shown in Table 2. As described above, additional $T_2^*$ maps were reconstructed using partial data from the original mGESEPI and bmGESEPI data sets, thus simulating acquisitions with a range of smaller N values and either the same $G_{c,max}/N$ ratio or the same $G_{c,max}$ value as the original data sets.

TABLE 2

Acquisition parameters for the GE, mGESEPI, and bmGESEPI $T_2^*$ measurements and $B_0$ mapping for the phantom and human studies.

| | phantom study | | human studies | |
|---|---|---|---|---|
| | $T_2^*$ measurements | $B_0$ mapping | $T_2^*$ measurements | $B_0$ mapping |
| RF pulse length (ms) | 2.0 | 0.5 | 2.0 | 0.5 |
| RF pulse shape | sinc | sinc | sinc | sinc |
| TR (ms) | 100 | 20 | 100 | 20 |
| TE (ms) | 5, . . ., 50 | 1.5 & 2.5 | 4.4, . . ., 44 | 1.2 & 3.0 |
| ΔTE (ms) | 5 | 1.0 | 4.4 | 1.8 |
| number of echoes | 10 | 2 | 10 | 2 |
| bandwidth (kHz) | 100 | 100 | 100 | 100 |
| field-of-view (cm) | 12 × 12 | 12 × 12 × 9 | 18 × 18 | 18 × 18 × 18 |
| matrix size | 256 × 256 | 96 × 96 × 72 | 256 × 256 | 96 × 96 × 96 |
| number of slices | 1 | — | 1 | — |
| slice thickness (mm) | 3 | — | 3 | — |
| flip angle (°) | 10 | 10 | 10 | 10 |
| $G_{c,max}$ | 160% (mGESEPI) 16% (bmGESEPI) | — | 160% (mGESEPI) 16% (bmGESEPI) | — |
| N | 80 (mGESEPI) 16 (bmGESEPI) | — | 80 (mGESEPI) 16 (bmGESEPI) | — |
| scan time (min:s) | 0:26 (GE) 34:08 (mGESEPI) 6:50 (bmGESEPI) | 2:18 | 0:26 (GE) 34:08 (mGESEPI) 6:50 (bmGESEPI) | 6:08 |

The system was also used to study a total of 4 postmortem unembalmed human subjects (2 male, 2 female, 72 to 81 years old) with various neuropathologies, and 2 healthy volunteers (1 male, 1 female, both 34 years old) who gave informed consent to the experimental protocol approved by an Institutional Review Board. $T_2^*$ measurements and Bo mapping were performed as in the phantom study, using the parameters shown in Table 2. $T_2^*$ maps were acquired on different axial, coronal, and sagittal slices throughout the brain. Note that because of the excessive acquisition time required, the comparison between the mGESEPI and bmGESEPI methods with equivalent parameters was performed only in postmortem studies.

Figure 4:
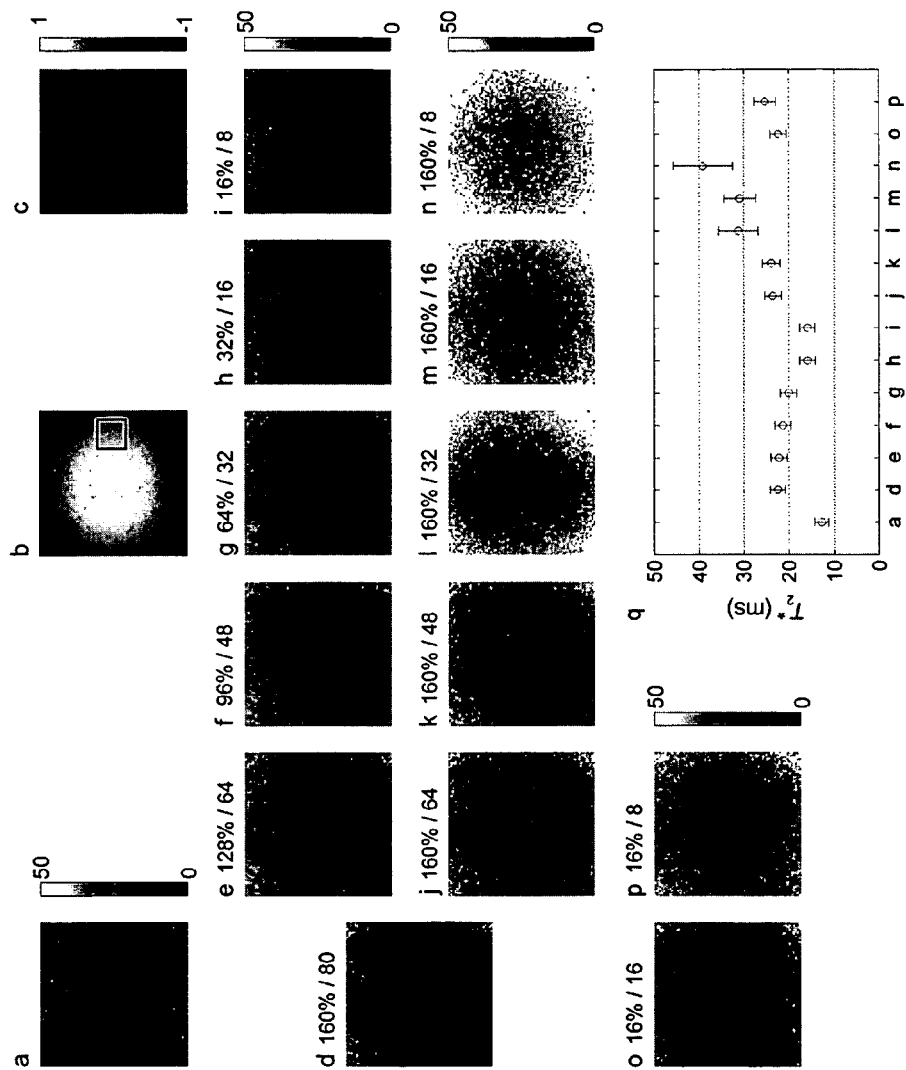
FIG. 4 illustrates an example set of axial $T_2$* maps of a selected region in the center of a phantom.

FIG. 4 shows axial $T_2^*$ maps of a selected region in the center of the phantom obtained with the GE, mGESEPI, and bmGESEPI methods using different $G_{c,max}$ and N parameters, as well as a corresponding magnitude image and a map of the $B_0$ gradient in the slice direction. Also shown is a plot of the average $T_2^*$ value in a region-of-interest for the different $T_2^*$ maps. In addition to severe $B_0$ inhomogeneity, ultra-high field MRI also suffers from severe $B_1$ inhomogeneity leading to substantial variations of the flip angle and receive sensitivity throughout the image volume. In this study, the $B_1$ inhomogeneity resulted in signal loss in the periphery of the phantom, shown at reference "b" of FIG. 4, and therefore inaccurate $T_2^*$ measurements in these regions. As such, all images were cropped to show only the central region of the phantom and thus focus on the $B_0$ rather than the $B_1$ effects. The GE $T_2^*$ map at reference "a" of FIG. 4, shows artificially low $T_2^*$ values on both sides of the image, resulting from $B_0$ inhomogeneity induced by susceptibility differences between the air-filled tube and the surrounding gel, shown at reference "c" of FIG. 4, (0.11 ppm/cm in the center vs. −0.23 ppm/cm in the region-of-interest shown at reference "b" of FIG. 4), even though the tube is not contained in the imaged slice. These artifacts can be largely corrected for by using the mGESEPI method with $G_{c,max}/N=160\%/80$, as shown by the more homogeneous $T_2^*$ map (reference "d" of FIG. 4), however at the cost of an excessive acquisition time. As expected, decreasing both $G_{c,max}$ and N progressively reduces the degree of $B_0$ inhomogeneity compensation, as shown by the regions with lower $T_2^*$ values appearing on both sides of the $T_2^*$ maps (reference "d" through "i" of FIG. 4), similar to what is observed with the GE method. Reducing only N while keeping the same $G_{c,max}$ also results in artifacts, namely an increase in $T_2^*$ (reference "j" through "n" of FIG. 4), because the $\Delta G_c$ increment becomes too large, in other words the oversampling becomes insufficient, for an accurate reconstruction of the images. On the other hand, the bmGESEPI method with $G_{c,max}/N=16\%/8$ can provide a $B_0$ inhomogeneity compensation that is similar to that achieved by the mGESEPI method with equivalent parameters (namely $G_{c,max}/N=160\%/80$), as shown by the homogeneous $T_2^*$ map (reference "p" of FIG. 4), while requiring only 10% of its acquisition time. In this particular study, the performance of the bmGESEPI method with $G_{c,max}/N=16\%/8$ was however not quite as good as that of the mGESEPI method with equivalent parameters. This may be due to insufficient oversampling or to the fact that the bmGESEPI method is more sensitive to gradient imbalance in the slice direction, which could result in a slight reduction of the area of each blip, and consequently of the overall $B_0$ inhomogeneity compensation. Nevertheless, increasing N to 16 resulted in a nearly identical $T_2^*$ map (reference "o" of FIG. 4) as the mGESEPI $T_2^*$ map with $G_{c,max}/N=160\%/80$, thus showing that the high efficiency of the bmGESEPI method allows trading off some acquisition time for a larger N value, and therefore more accurate $T_2^*$ measurements. These results clearly demonstrate the significant advantages of the bmGESEPI method over the mGESEPI method.

Figure 5:
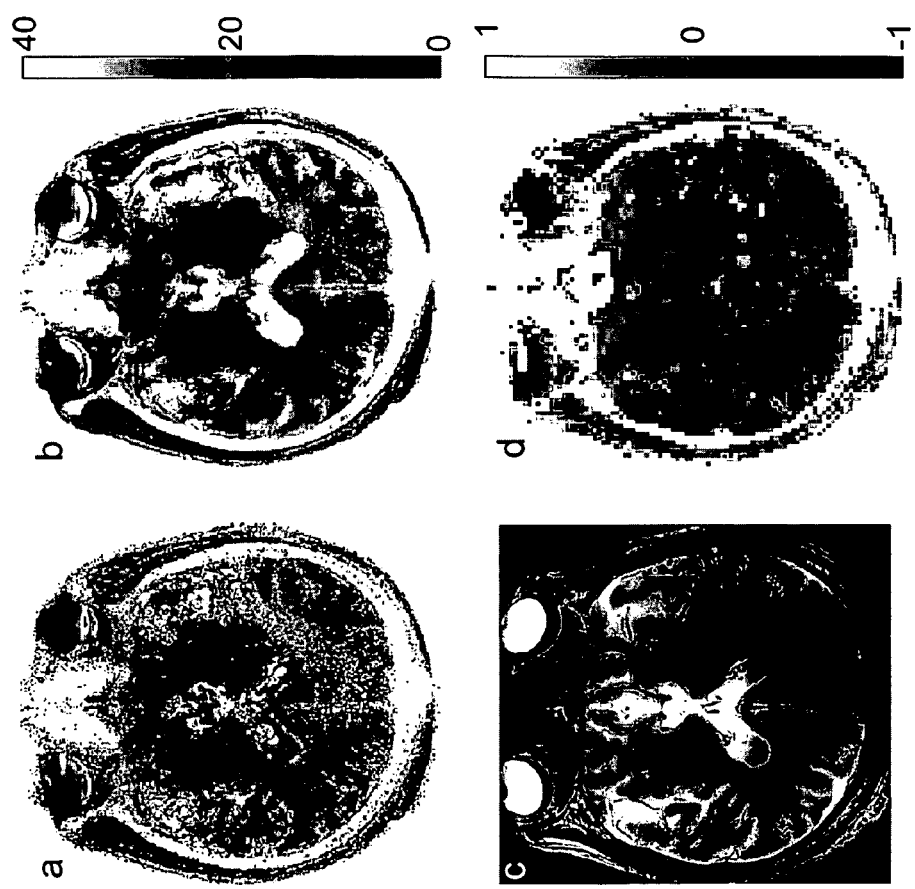
FIG. 5 illustrates an example set of axial $T_2$* maps of the brain of a postmortem human subject in accordance with the present invention.
Figure 6:
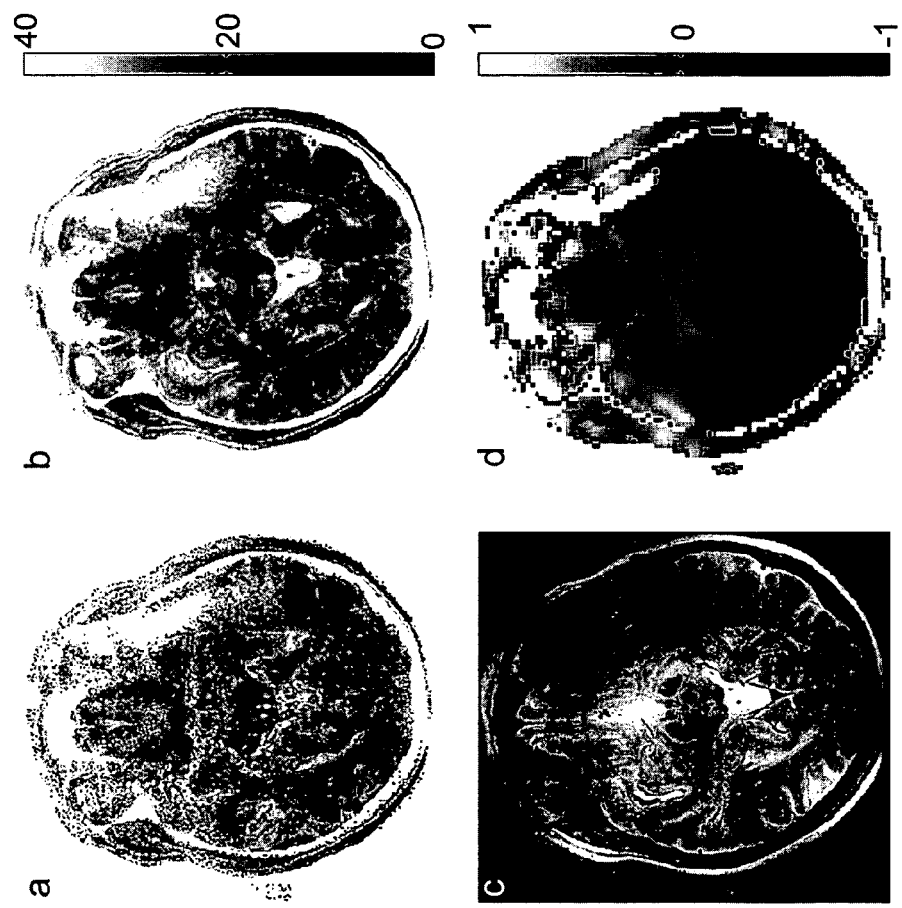
FIG. 6 illustrates an example set of axial $T_2$* maps of the brain of a healthy volunteer in accordance with the present invention.

Such a comparison between the GE, mGESEPI, and bmGESEPI methods using different $G_{c,max}$ and N parameters was also performed in postmortem human subjects and showed similar results. FIGS. 5 and 6 show axial $T_2^*$ maps of the brain of a postmortem human subject and a healthy volunteer respectively, obtained with the GE and bmGESEPI methods, as well as corresponding spin echo images and maps of the $B_0$ gradient in the slice direction. The GE $T_2$ maps (FIGS. 5a and 6a) show artificially low $T_2^*$ values due to $B_0$ inhomogeneity, and consequently anatomical structures are not correctly depicted. On the other hand, the bmGESEPI $T_2^*$ maps (FIGS. 5b and 6b) show higher $T_2^*$ values with a clear delineation between the cerebral hemispheres and the ventricles. Other cerebrospinal fluid spaces are seen as regions with intermediate $T_2^*$ values, presumably due to partial volume averaging. In addition, brain nuclei such as the putamen and globus pallidus are depicted with lower $T_2^*$ values than the surrounding brain tissue (FIG. 5b) due to their high iron content, although this effect is not always very pronounced. There are residual artifacts in the central inferior frontal lobes just superior to the planum sphenoidale, where the $B_0$ inhomogeneity is most severe (FIGS. 5d and 6d). However, this is expected because in this region, the $B_0$ gradient in the slice direction $G_{z,susc}$ is larger than the chosen threshold of $G_{z,susc,max}=0.8$ ppm/cm. Note that signal loss in the left posterior (FIG. 5c) or left anterior (FIG. 6c) regions of the brain is due to $B_1$ inhomogeneity, in other words to low flip angle and/or receive sensitivity, as typically observed on axial images of the human brain acquired at ultra-high field strength, resulting in artifacts on both the GE and bmGESEPI $T_2^*$ maps in these regions. The results presented here clearly show the effectiveness of the bmGESEPI method for in vivo $T_2^*$ measurements. Similar results were obtained in coronal, sagittal, and more superior axial slices, although with a less pronounced effect, because the $B_0$ inhomogeneity is less severe, except in regions close to air/tissue interfaces in the inferior frontal and temporal lobes.

Table 3 shows bmGESEPI $T_2^*$ values in different regions of the brain averaged across subjects. For both postmortem and in vivo studies, the putamen and globus pallidus have lower $T_2^*$ values than cortical gray matter (GM) and white matter (WM), which can be attributed to their high iron content. On the other hand, it appears that there is very little $T_2^*$ contrast between GM and WM, as can also be seen directly on the bmGESEPI $T_2^*$ maps (FIGS. 5b and 6b), even though a GM/WM contrast is clearly visible on the spin echo images (FIGS. 5c and 6c). These initial findings are reproducible. Although Table 3 shows $T_2^*$ differences between the postmortem and in vivo studies, a direct comparison might not be very meaningful because the postmortem subjects were older and had various neuropathologies, whereas the volunteers were young and healthy subjects. Finally, note that the vessel contrast present on the magnitude images (FIGS. 5c and 6c) is significantly reduced on the $T_2$ maps for both postmortem and in vivo studies. However, this is not unexpected because the $T_2^*$ of venous blood at ultra-high field strength is shorter than the shortest TE used for the $T_2^*$ measurements in the studies, namely 4.4 ms.

TABLE 3 bmGESEPI $T_2^*$ values (mean ± standard deviation, in ms) in different regions of the brain averaged across subjects.

|  | postmortem | in vivo |
|---|---|---|
| cortical gray matter | 16.3 ± 1.3 | 20.4 ± 2.3 |
| white matter | 16.8 ± 1.3 | 20.6 ± 1.9 |
| putamen | 13.7 ± 0.9 | 17.2 ± 1.4 |
| globus pallidus | 13.9 ± 1.3 | 17.0 ± 1.5 |

The studies clearly show that $T_2^*$ measurements using a conventional 2D multi-echo GE method are severely affected by $B_0$ inhomogeneity at ultra-high field strength, resulting in erroneous $T_2^*$ values. The mGESEPI method for $T_2^*$-weighted imaging and $T_2^*$ measurement with $B_0$ inhomogeneity compensation can correct for these artifacts and provide accurate $T_2^*$ measurements, however at the expense of prohibitive acquisition times, particularly for in vivo studies. Previous in vivo human studies used only a limited number of compensation gradient steps N, namely 8 or 16, which is not sufficient to provide accurate $T_2^*$ measurements at ultra-high field strength. In the new bmGESEPI method, and unlike in the mGESEPI method, the same susceptibility-induced gradient in the slice direction $G_{z,susc}$ is compensated for at each echo, making this method much more efficient, thus allowing significantly faster and accurate $T_2^*$ measurements.

Although the studies performed in this work used single slice acquisitions, the bmGESEPI method can be applied to multislice acquisitions as well, with the maximum number of slices ultimately limited by TR. Parallel imaging techniques such as SENSE or SMASH could be used to further increase the efficiency of the bmGESEPI method and allow extended spatial coverage with reasonable acquisition times.

The present invention solves problems due to susceptibility artifacts occurring in $T_2^*$-weighted imaging and $T_2^*$ relaxation time measurements by compensating for the static magnetic field inhomogeneities. It is an advantage of the present invention that it is faster and more efficient than the prior art imaging methods.

Figure 7:
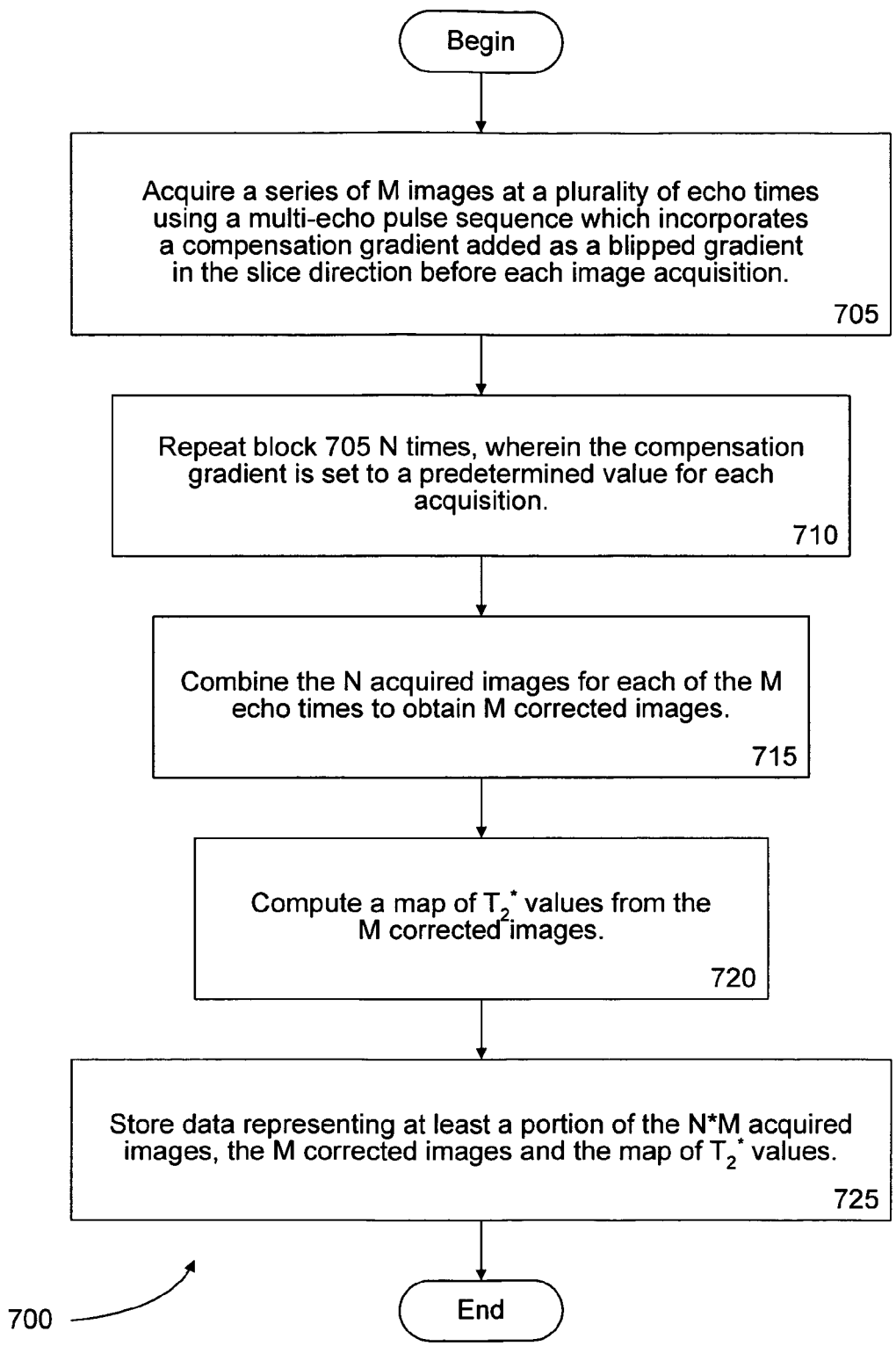
FIG. 7 is a flowchart illustrating the processing steps of an example method for producing magnetic resonance image data.

Referring now to FIG. 7, there is a flowchart illustrating an example methodology 700 for producing magnetic resonance imaging data. At block 705, a system controller acquires a series of M images at a plurality of echo times using a multi-echo pulse sequence. A compensation gradient is added as a blipped gradient in the slice direction before the first image acquisition and between each subsequent image acquisitions to compensate for static magnetic field inhomogeneities. As shown at block 710, the step of acquiring the series of M images is repeated N times. For each acquisition, the compensation gradient is set to a predetermined value for each acquisition. In some embodiments, all of these compensation gradient values will be different.

At block 715, the N acquired images for each of the M echo times are combined to obtain M corrected images. A map of $T_2^*$ values is computed from the M corrected images at block 720, and data representing at least a portion of the N*M acquired images, the M corrected images and the map of $T_2^*$ values is stored at block 725.

What has been described above includes several examples. It is, of course, not possible to describe every conceivable combination of components or methodologies for purposes of describing the systems, apparatus, methods, and computer readable media associated with magnetic resonance imaging. However, one of ordinary skill in the art may recognize that further combinations and permutations are possible. Accordingly, this application is intended to embrace such alterations, modifications, and variations that fall within the scope of the appended claims. Furthermore, to the extent that the term "includes" is employed in the detailed description or the claims, such term is intended to be inclusive in a manner similar to the term "comprising" as that term is interpreted when employed as a transitional word in a claim.

What is claimed is:

1. A method for producing magnetic resonance imaging data, comprising:
   acquiring a series of M images at a plurality of echo times using a multi-echo pulse sequence, wherein a compensation gradient is added as a blipped gradient in the slice direction before the first image acquisition and between each subsequent image acquisitions to compensate for static magnetic field inhomogeneities;
   repeating the step of acquiring the series of M images N times, wherein the compensation gradient is set to a predetermined value for each acquisition;
   combining the N acquired images for each of the M echo times to obtain M corrected images;
   computing a map of $T_2^*$ values from the M corrected images; and
   storing data representing at least a portion of: the N*M acquired images, the M corrected images and the map of $T_2^*$ values.

2. The method as recited in claim 1, wherein each image is acquired using a gradient echo readout.

3. The method as recited in claim 2, wherein the images are acquired using readout gradients of same polarity.

4. The method as recited in claim 2, wherein the images are acquired using readout gradients of alternate polarity for the different echo times.

5. The method as recited in claim 4, further comprising correcting misregistration errors through post-processing.

6. The method as recited in claim 1, wherein each image is acquired using an echo planar imaging readout.

7. The method as recited in claim 1, wherein each image is acquired using a spiral readout.

8. The method as recited in claim 1, wherein the N compensation gradient values are equidistant.

9. The method as recited in claim 1, wherein the N compensation gradient values are determined from an independently acquired map of a static magnetic field.

10. The method as recited in claim 1, wherein the N compensation gradient values are determined from a simulated map of a static magnetic field.

11. The method as recited in claim 1, further comprising:
    combining the corrected images using a Fourier transform along the slice direction; and
    summing a subset of the images.

12. The method as recited in claim 1, further comprising combining the corrected images using maximum intensity projection along the slice direction.

13. The method as recited in claim 1, further comprising combining the corrected images by computing the square root of the sum of squares.

14. The method as recited in claim 1, further comprising combining the corrected images by weighted summation.

15. The method as recited in claim 1, wherein the map of the $T_2^*$ values is computer by fitting a monoexponential decay function to the series of M corrected images.

16. The method as recited in claim 1, wherein the map of the $T_2^*$ values is computed by computing the Fourier transform of the M corrected images along the echo dimension and finding the peak of the Lorentzian line pixel-by-pixel.

17. A magnetic resonance imaging system, comprising:
    an image acquisition apparatus for acquiring image data; and
    a controller for controlling the image acquisition apparatus, the controller including:
    a processor;
    a memory connected to the processor storing a program to control operation of the processor;
    the processor operative with the program in the memory to:
       acquire a series of M images at a plurality of echo times using a multi-echo pulse sequence, wherein a compensation gradient is added as a blipped gradient in the slice direction before the first image acquisition and between each subsequent image acquisitions to compensate for static magnetic field inhomogeneities;
       repeat the acquisition of the series of M images N times, wherein the compensation gradient is set to a predetermined value for each acquisition;
       combine the N acquired images for each of the M echo times to obtain M corrected images;
       compute a map of $T_2^*$ values from the M corrected images; and
       store data representing at least a portion of: the N*M acquired images, the M corrected images and the map of $T_2^*$ values.

18. A computer-readable storage medium encoded with processing instructions for implementing a method for acquiring magnetic resonance imaging data, the processing instructions for directing a computer to perform the steps of:
    acquiring a series of M images at a plurality of echo times using a multi-echo pulse sequence, wherein a compensation gradient is added as a blipped gradient in the slice direction before the first image acquisition and between each subsequent image acquisitions to compensate for static magnetic field inhomogeneities;
    repeating the step of acquiring the series of M images N times, wherein the compensation gradient is set to a predetermined value for each acquisition;
    combining the N acquired images for each of the M echo times to obtain M corrected images;
    computing a map of $T_2^*$ values from the M corrected images; and
    storing data representing at least a portion of: the N*M acquired images, the M corrected images and the map of $T_2^*$ values.

* * * * *